(12) United States Patent
Kwack

(10) Patent No.: US 7,577,046 B2
(45) Date of Patent: Aug. 18, 2009

(54) CIRCUIT AND METHOD FOR GENERATING COLUMN PATH CONTROL SIGNALS IN SEMICONDUCTOR DEVICE

(75) Inventor: Seung Wook Kwack, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 82 days.

(21) Appl. No.: 11/818,580

(22) Filed: Jun. 15, 2007

(65) Prior Publication Data

US 2008/0089147 A1 Apr. 17, 2008

(30) Foreign Application Priority Data

Oct. 17, 2006 (KR) .................. 10-2006-0101002

(51) Int. Cl.
*G11C 7/00* (2006.01)
*G11C 8/00* (2006.01)

(52) U.S. Cl. .................. 365/193; 365/194; 365/189.08; 365/203; 365/205

(58) Field of Classification Search ................. 365/193, 365/194, 230.06, 230.08, 233.1, 189.05, 365/189.08, 203, 205, 207, 208
See application file for complete search history.

(56) References Cited

U.S. PATENT DOCUMENTS

| | | | |
|---|---|---|---|
| 6,466,491 B2 * | 10/2002 | Yanagawa | 365/193 |
| 6,622,256 B1 * | 9/2003 | Dabral et al. | 365/193 |
| 6,629,222 B1 * | 9/2003 | Jeddeloh | 365/193 |
| 6,707,723 B2 * | 3/2004 | Jeong | 365/193 |
| 6,819,602 B2 | 11/2004 | Seo et al. | |
| 6,918,048 B2 * | 7/2005 | Zumkehr | 365/193 |
| 7,050,352 B2 * | 5/2006 | Cha | 365/193 |
| 7,161,854 B2 * | 1/2007 | Iwasaki | 365/193 |
| 7,219,269 B2 | 5/2007 | Frisch | |
| 7,272,055 B2 * | 9/2007 | Kishimoto et al. | 365/193 |
| 7,280,417 B2 * | 10/2007 | Choi et al. | 365/193 |
| 7,376,043 B2 * | 5/2008 | Murayama | 365/194 |
| 7,414,901 B2 * | 8/2008 | Kishimoto et al. | 365/194 |

FOREIGN PATENT DOCUMENTS

| KR | 10-2003-0052563 A | 6/2003 |
|---|---|---|
| KR | 10-2004-0056602 A | 7/2004 |
| KR | 10-2005-0076202 A | 7/2005 |
| KR | 10-2005-0115563 A | 12/2005 |

* cited by examiner

*Primary Examiner*—Trong Phan
(74) *Attorney, Agent, or Firm*—John P. White; Cooper & Dunham LLP

(57) ABSTRACT

A circuit for generating column path control signals in a semiconductor device is provided. The circuit includes a strobe signal delay unit configured to receive a strobe signal, and delay the received strobe signal for different delay periods, to generate a plurality of respective delayed strobe signals, and a control signal generator configured to receive at least one of the delayed strobe signals, and perform a logical operation to the received signal, to generate a first column path control signal for controlling a column path of the semiconductor device.

18 Claims, 6 Drawing Sheets

CIRCUIT AND METHOD FOR GENERATING COLUMN PATH CONTROL SIGNALS IN SEMICONDUCTOR DEVICE

BACKGROUND

The present disclosure relates to a circuit and method for generating column path control signals in a semiconductor device, wherein the column path control signals can be generated under the condition in which they have been influenced by the same process, voltage, and temperature (PVT) characteristic variation of CMOS transistors.

In general, a semiconductor device, in particular, a DRAM, needs various column path control signals for execution of a read or write operation. For example, column path control signals required for execution of a read or write operation in a DRAM include local input/output line precharge signals (for example, liopcg and lio_pcgback in FIG. 1) for controlling an operation of precharging signals on local input/output lines, a local input/output line reset signal (for example, lio_rst in FIG. 1) for equalizing the levels of the local input/output lines in response to the local input/output line precharge signals (for example, liopcg and lio_pcgback in FIG. 1), an output enable signal (for example, yi in FIG. 1) enabling transfer of bit line signals amplified by a sense amplifier to the local input/output lines in accordance with a read command, an amplification control signal (for example, iosa1 in FIG. 1) for controlling an operation of amplifying the signals on the local input/output lines in the read operation, a latch control signal (for example, iosa2 in FIG. 1) for controlling an operation of latching the amplified signals on the local input/output lines in the read operation, and a pull-up/pull-down control signal (for example, bwen in FIG. 1) for controlling a pull-up/pull-down operation for global input/output lines (for example, gio in FIG. 1) in a write operation. These control signals can be generated based on the same strobe signal.

FIG. 1 illustrates a configuration of a conventional column path control signal generating circuit.

The column path control signal generating circuit shown in FIG. 1 generates a plurality of column path control signals (liopcg, lio_rst, lio_pcgback, bwen, yi, iosa1, and iosa2) for a read or write operation in a DRAM, in accordance with parallel processing of a strobe signal. The column path control signal generating circuit of FIG. 1 includes first to fifth delay units 1 to 5 each adapted for delaying the strobe signal for a certain period, independently of the remaining delay units, inverters IV3 to IV12 connected in pairs to the first to fifth delay units 1 to 5, and delays 6 and 7. In accordance with the independent delay operations of the delay units 1 to 5, and delay operations of the delays 6 and 7, the column path control signals liopcg, lio_rst, lio_pcgback, bwen, yi, iosa1, and iosa2 are generated.

However, CMOS transistors included in the first to fifth delay units 1 to 5, and inverters IV3 to IV12, respectively, may exhibit different variations in process, voltage and temperature (PVT) characteristics. For this reason, the timings of the column path control signals liopcg, lio_rst, lio_pcgback, bwen, yi, iosa1, and iosa2 generated in a parallel manner through the first to fifth delay units 1 to 5 and inverters IV3 to IV12 may not coincide due to the different PVT characteristic variations of the associated CMOS transistors. As a result, there is a problem in that an erroneous read or write operation is carried out.

An improved approach for generating the column path control signals is needed.

BRIEF SUMMARY

In one aspect of the present disclosure, a circuit for generating column path control signals in a semiconductor device comprises a strobe signal delay unit for receiving a strobe signal, and delaying the received strobe signal for different delay periods, to generate a plurality of respective delayed strobe signals, and a control signal generator for receiving at least one of the delayed strobe signals, and performing a logical operation to the received signal, to generate a first column path control signal for controlling a column path of the semiconductor device.

The strobe signal delay unit may comprise a plurality of delays connected in series.

The delays may include respective inverters to form an inverter chain.

The strobe signal delay unit may comprise a first delay unit for delaying the strobe signal for a first delay period, to generate a first delayed strobe signal, and a second delay unit for delaying the first delayed strobe signal for a second delay period, to generate a second delayed strobe signal.

The control signal generator may comprise a logic unit for receiving the first and second delayed strobe signals, and performing a logical operation to the received signals, and a buffer for receiving an output signal from the logic unit, and buffering the received signal, to generate the first column path control signal.

The circuit may further comprise a delay for delaying an output signal from the strobe signal delay unit for a predetermined period, to generate a second column path control signal for controlling a signal on a local input/output line in a read operation.

The circuit may further comprise a first delay for delaying an output signal from the strobe signal delay unit for a predetermined period, to generate a second column path control signal for controlling an operation of amplifying a signal on a local input/output line in a read operation, and a second delay for delaying the second column path control signal for a predetermined period, to generate a third column path control signal for controlling an operation of latching the amplified signal on the local input/output line.

In another aspect of the present disclosure, a circuit for generating a column path control signal in a semiconductor device comprises a strobe signal delay unit for receiving a strobe signal, and delaying the received strobe signal for a predetermined period, to generate a delayed strobe signal, and a control signal generator for delaying the delayed strobe signal unit for a predetermined period, to generate a column path control signal for controlling a signal on a local input/output line in a read operation.

In another aspect of the present disclosure, a circuit for generating column path control signals in a semiconductor device comprises a strobe signal delay unit for receiving a strobe signal, and delaying the received strobe signal for a predetermined period, to generate a delayed strobe signal, a first delay for delaying the delayed strobe signal for a predetermined period, to generate a first column path control signal for controlling an operation of amplifying a signal on a local input/output line in a read operation, and a second delay for delaying the first column path control signal for a predetermined period, to generate a second column path control signal for controlling an operation of latching the amplified signal on the local input/output line.

In another aspect of the present disclosure, a circuit for generating column path control signals in a semiconductor device comprises a strobe signal delay unit for receiving a strobe signal, and delaying the received strobe signal for different delay periods, to generate a plurality of respective delayed strobe signals, the strobe signal delay unit comprising a first delay unit for delaying the strobe signal for a first delay period, to generate a first delayed strobe signal, and a second delay unit for delaying the first delayed strobe signal for a second delay period, to generate a second delayed strobe signal, a control signal generator for receiving the first and second delayed strobe signals, and performing a logical operation to the received signal, to generate a first column path control signal for controlling a column path of the semiconductor device, a first delay for delaying an output signal from the strobe signal delay unit for a predetermined period, to generate a second column path control signal for controlling an operation of amplifying a signal on a local input/output line in a read operation, and a second delay for delaying the second column path control signal for a predetermined period, to generate a third column path control signal for controlling an operation of latching the amplified signal on the local input/output line.

The control signal generator may comprise a logic unit for receiving the first and second delayed strobe signals, and performing a logical operation to the received signals, and a buffer for receiving an output signal from the logic unit, and buffering the received signal, to generate the first column path control signal.

In another aspect of the present disclosure, a method for generating column path control signals in a semiconductor device comprises generating a plurality of delayed strobe signals delayed from a strobe signal for different respective delay periods, selecting at least one from the plurality of delayed strobe signals, and performing a logical operation to the selected delayed strobe signal(s), thereby generating a first column path control signal for controlling a column path of the semiconductor device.

The method may further comprise delaying the selected delayed strobe signal for a predetermined period, thereby generating a second column path control signal for controlling a signal on a local input/output line in a read operation.

The method may further comprise delaying the selected delayed strobe signal for a predetermined period, thereby generating a second column path control signal for controlling an operation of amplifying a signal on a local input/output line in a read operation, and delaying the second column path control signal for a predetermined period, thereby generating a third column path control signal for controlling an operation of latching the amplified signal on the local input/output line.

In another aspect of the present disclosure, a method for generating a column path control signal in a semiconductor device comprises receiving a strobe signal, and generating a first delayed strobe signal delayed from the strobe signal for a first delay period and a second delayed strobe signal delayed from the strobe signal for a second delay period, and performing a logical operation to the first and second delayed strobe signals, thereby generating a column path control signal for controlling a column path of the semiconductor device.

In still another aspect of the present disclosure, a method for generating column path control signals in a semiconductor device comprises delaying a strobe signal for a predetermined period, thereby generating a delayed strobe signal, delaying the delayed strobe signal for a predetermined period, thereby generating a first column path control signal for controlling an operation of amplifying a signal on a local input/output line in a read operation, and delaying the first column path control signal for a predetermined period, thereby generating a second column path control signal for controlling an operation of latching the amplified signal on the local input/output line.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Preferred embodiments of the present disclosure will now be described in detail with reference to the accompanying drawings.

In a column path control signal generating circuit and method according to the present disclosure, generation of column path control signals required for a read/write operation in a semiconductor device is achieved, using delay of a strobe signal through the same delay unit. Accordingly, the column path control signals can be generated under the condition in which they have been influenced by the same process, voltage, and temperature (PVT) characteristic variation of CMOS transistors. As a result, the initially-designed timing margins among the column path control signals can be maintained.

Figure 1:
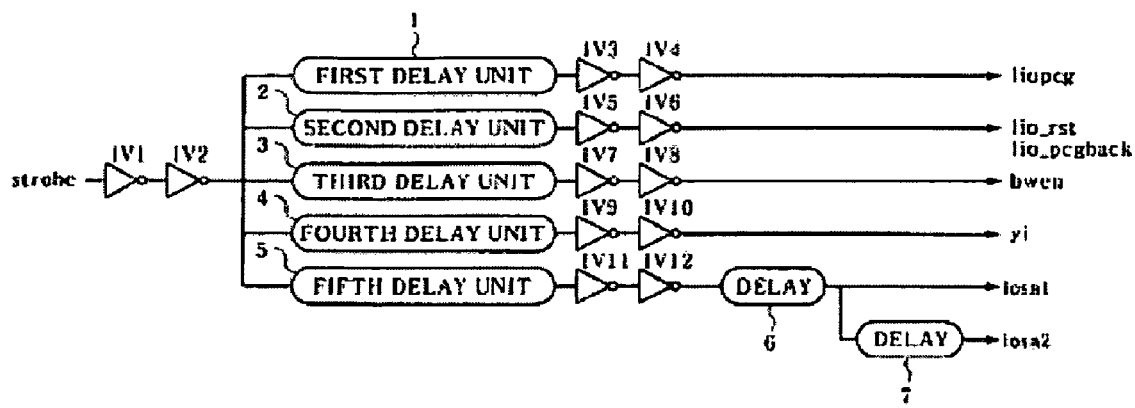
FIG. 1 is a circuit diagram illustrating a configuration of a conventional column path control signal generating circuit.
Figure 2A:
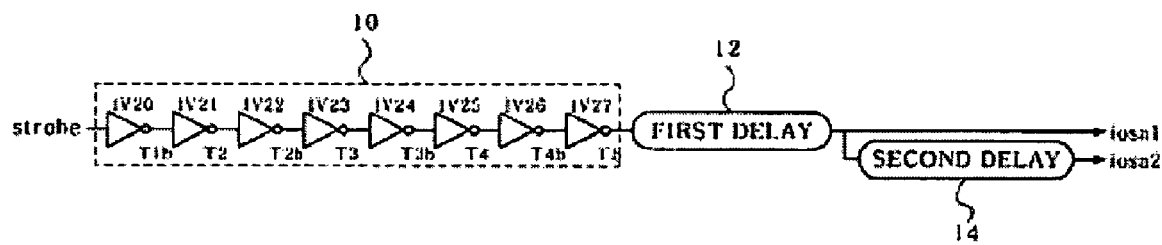
FIGS. 2A through 2C illustrate respective circuit diagrams illustrating configurations of a column path control signal generating circuit according to an exemplary embodiment of the present disclosure.
Figure 2B:
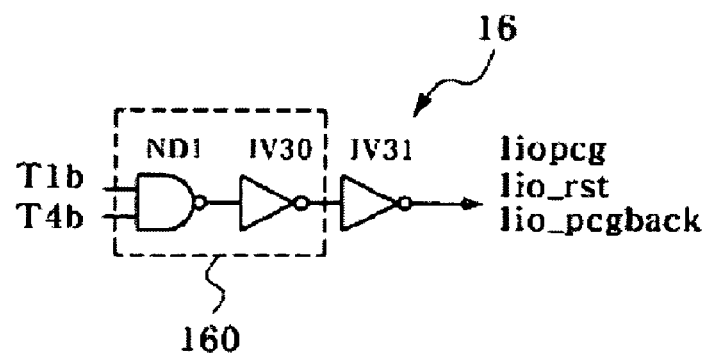
Figure 2C:
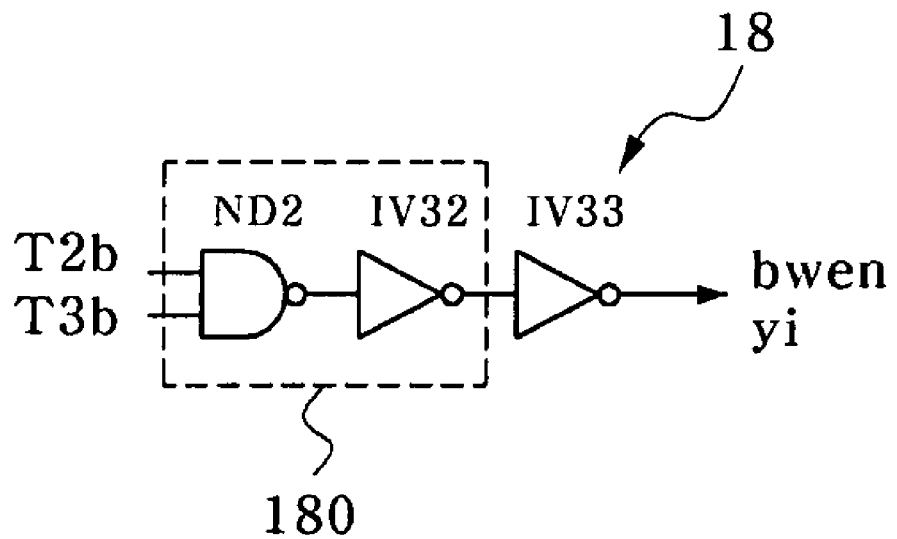

FIGS. 2A to 2C are circuit diagrams illustrating a column path control signal generating circuit according to an exemplary embodiment of the present disclosure.

As shown in FIG. 2A, the column path control signal generating circuit includes a strobe signal delay unit 10 which receives an input strobe signal strobe, and delays the input strobe signal strobe for different delay periods, to generate a plurality of respective delayed strobe signals T1b to T4b and T2 to T5. The circuit also includes a first delay 12 which delays the delayed strobe signal T5 for a predetermined delay period, to generate an amplification control signal iosa1 for controlling an operation of amplifying signals on local input/output lines in a read operation, and a second delay 14 which delays the amplification control signal iosa1 for a predetermined delay period, to generate a latch control signal iosa2 for controlling an operation of latching the amplified signals on the local input/out lines in the read operation.

The strobe signal delay unit 10 is constituted by an inverter chain including a plurality of inverters IV20 to IV27. The delayed strobe signals T1b to T4b and T2 to T5 output from the inverters IV20 to IV27 are signals generated by delaying the input strobe signal strobe for different respective delay periods.

As shown in FIGS. 2B and 2C, the column path control signal generating circuit according to the illustrated embodiment of the present disclosure further includes first and second control signal generators 16 and 18 which receive the delayed strobe signals T1b and T4b and the delayed strobe signals T2b and T3b, and generate column path control signals liopcg, lio_rst, and lio_pcgback and column path control signals bwen and yi, based on the received signals. In detail, the first control signal generator 16 includes a logic unit 160 which receives the delayed strobe signals T1b and T4b, and performs an ANDing operation to the received signals T1b and T4b. The logic unit 160 includes a NAND gate ND1 and an inverter IV30. The first control signal generator 16 also includes an inverter IV31 for buffering an output signal from the logic unit 160, thereby generating the first and second local input/output line precharge signal lio_pcgback and liopcg, and the local input/output line reset signal lio_rst. On the other hand, the second control signal generator 18 includes a logic unit 180 which receives the delayed strobe signals T2b and T3b, and performs an ANDing operation to the received signals T2b and T3b. The logic unit 180 includes a NAND gate ND2 and an inverter IV32. The second control signal generator 18 also includes an inverter IV33 for buffering an output signal from the logic unit 180, thereby generating the pull-up/pull-down control signal bwen and the output enable signal yi.

Hereinafter, operation of the column path control signal generating circuit having the above-described configuration will be described with reference to FIGS. 2A to 2C, FIG. 3 which depicts timing diagrams of delayed strobe signals generated in the strobe signal delay unit 10 according to this embodiment, and FIG. 4 which depicts timing diagrams of column path control signals generated in the control signal generators 16 and 18 and in the first and second delays 12 and 14.

Figure 3:
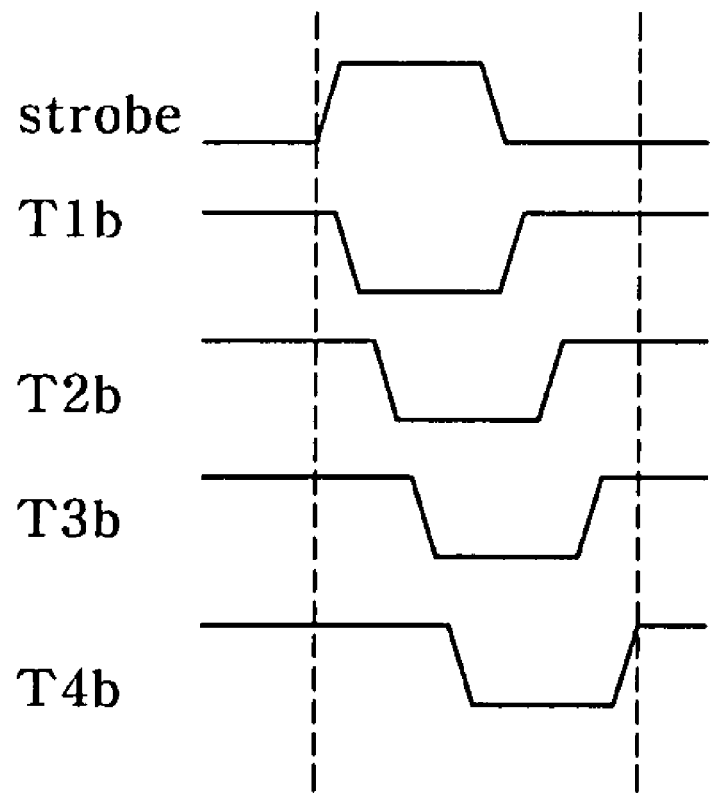
FIG. 3 is a timing diagram of delayed strobe signals generated from a strobe signal delay unit according to the exemplary embodiment of FIGS. 2A through 2C.

First, the strobe signal delay unit 10 receives the strobe signal strobe, and generates delayed strobe signals T2 to T5 and T1b to T4b having different delay periods. The delayed strobe signals T2 to T5 and T1b to T4b are signals obtained after delaying the strobe signal strobe for predetermined periods by the inverters IV20 to IV27, respectively. In particular, the delayed strobe signals T1b to T4b are signals obtained after delaying the strobe signal strobe for respective predetermined periods, and then inverting the resultant signals. Referring to FIG. 3, it is possible to identify the timings of the delayed strobe signals T1b to T4b and the base signal thereof, namely, the strobe signal strobe.

Next, the first delay 12 receives the delayed strobe signal T5 output from the inverter IV27 of the strobe signal delay unit 10, and delays the received signal T5 for a predetermined period, to generate the amplification control signal iosa1 for controlling an operation of amplifying signals on local input/output lines in a read operation. The second delay 14 delays the amplification control signal iosa1 for a predetermined period, to generate the latch control signal iosa2 for controlling an operation of latching the amplified signals on the local input/output lines.

Meanwhile, the first control signal generator 16 receives the delayed strobe signals T1b and T4b having different delay periods, and generates the first and second local input/output line precharge signals lio_pcgback and liopcg and the local input/output line reset signal lio_rst. When both the delayed strobe signals T1b and T4b have a low level, each of the first and second local input/output line precharge signals lio_pcgback and liopcg and the local input/output line reset signal lio_rst has a high level.

As described above, the column path control signal generating circuit according to the illustrated embodiment of the present disclosure delays the strobe signal strobe for different delay periods by the single strobe signal delay unit 10, thereby generating the delayed strobe signals T5 and T1b to T4b, and then delays, or performs a logical operation to, the generated delayed strobe signals T5 and T1b to T4b, thereby generating the column path control signals liopcg, lio_rst, lio_pcgback, bwen, yi, iosa1, and iosa2. Accordingly, the column path control signals liopcg, lio_rst, lio_pcgback, bwen, yi, iosa1, and iosa2 can be generated under the condition in which they have been influenced by the same pressure, voltage, and temperature (PVT) characteristic variation of CMOS transistors. As a result, in spite of PVT characteristic variations of CMOS transistors, desired timing margins among the column path control signals liopcg, lio_rst, lio_pcgback, bwen, yi, iosa1, and iosa2 can be maintained, as shown in FIG. 4.

Figure 5:
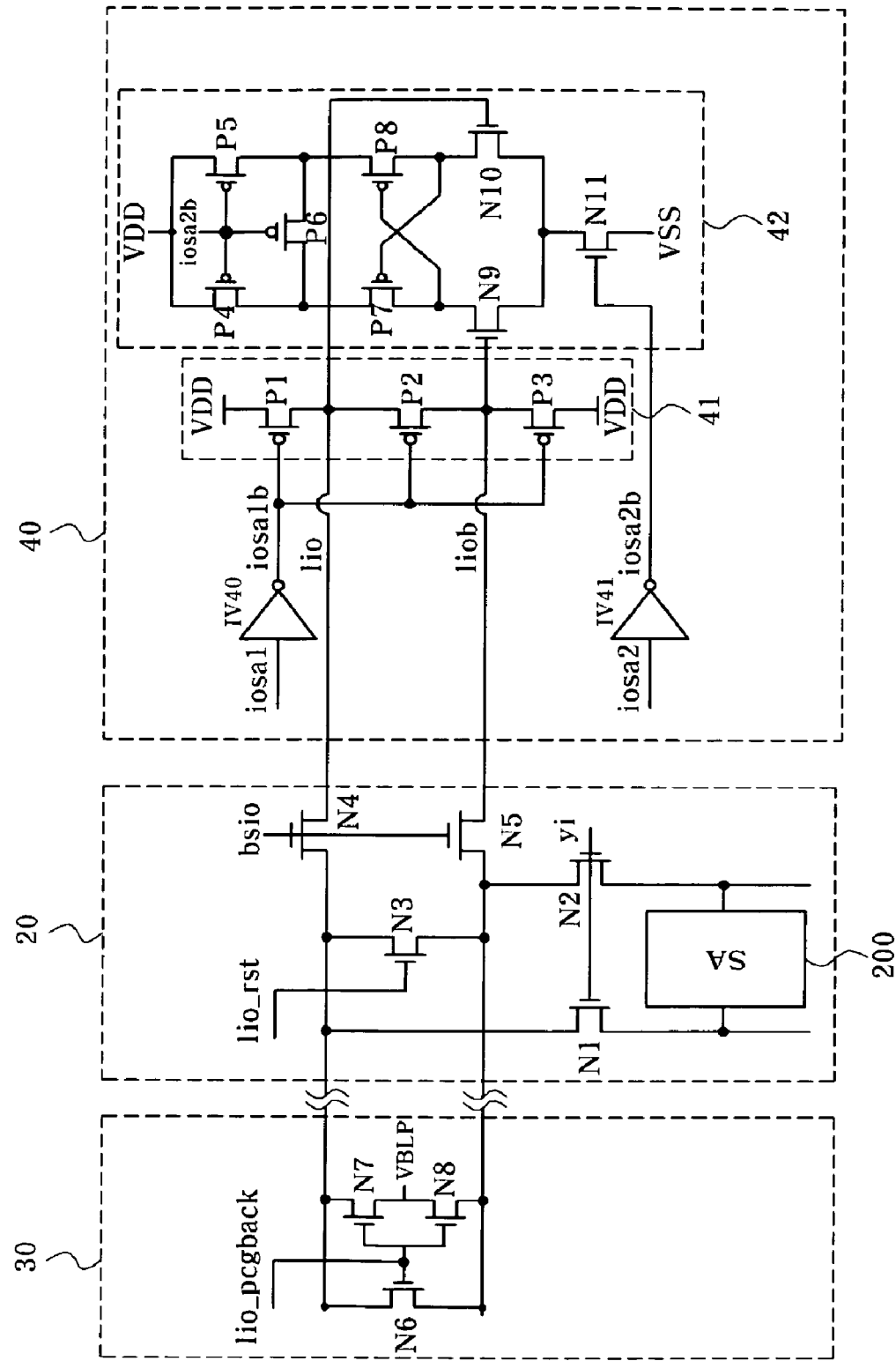
FIG. 5 is a circuit diagram of a column path control circuit controlled by column path control signals generated in accordance with the exemplary embodiment of FIGS. 2A through 2C.
Figure 6A:
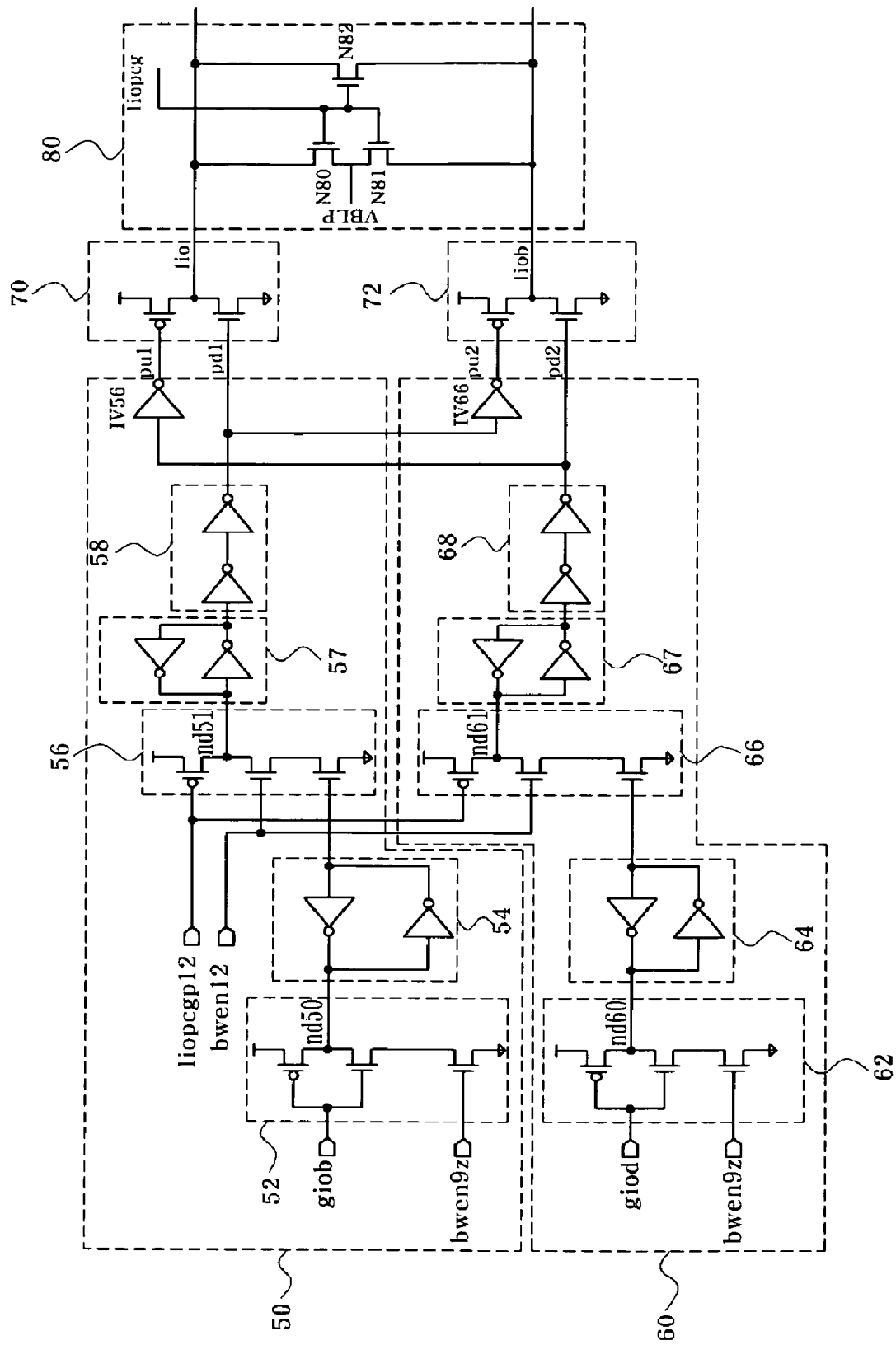
FIGS. 6A and 6B are circuit diagrams of a write driver controller by the column path control signals generated in accordance with the exemplary embodiment of FIGS. 2A through 2C.
Figure 6B:
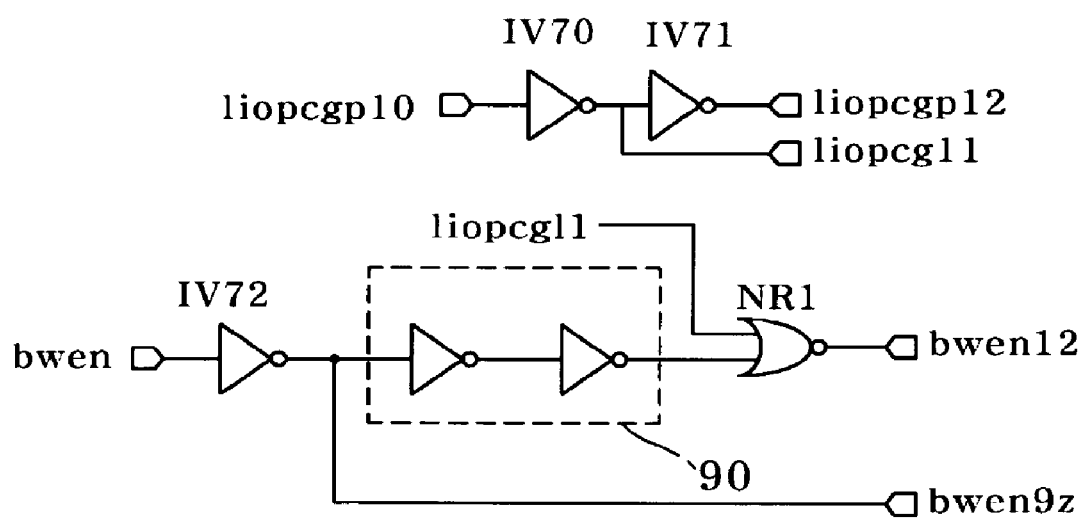

Hereinafter, operations of a column path control circuit and a write driver controlled by the column path control signals liopcg, lio_rst, lio_pcgback, bwen, yi, iosa1, and iosa2 generated in a column path control signal generating circuit according to another illustrated embodiment of the present disclosure will be described with reference to FIGS. 4, 5, 6A, and 6B. Referring to FIG. 5, the column path control circuit includes a core controller 20, a local input/output line controller 30, and a column path controller 40. The core controller 20 comprises a NMOS transistor N3 turned on in response to a local input/output line reset signal lio_rst, NMOS transistors N4, N5 turned on in response to a input/output switch signal bsio, and NMOS transistors N1, N2 turned on in response to a output enable signal yi to enable transfer of bit line signals amplified by a sense amplifier to local input/output lines. The local input/output line controller 30 comprises NMOS transistors N6, N7, NB turned on in response to a first local input/output line precharge signal lio pcgback to supply the bit line precharge voltage VBLP. The column path controller 40 comprises an inverter IV40, an inverter IV41, a local input output line amplifier 41 and a local input output line latch 42. The inverter IV40 inverts a amplification control signal iosa1 to generate a inverted amplification control signal iosa1b. The inverter IV41 inverts a latch control signal iosa2 to generate a inverted latch control signal iosa2b. The local input output line amplifier 41 is comprise of the PMOS transistors P1, P2, P3 turned on in response to the inverted amplification control signal iosa1b to drive a local input/output line lio and a inverted local input/output line liob as a level of a external voltage VDD. The local input/output line latch unit 42 comprises a NMOS transistor N11 and PMOS transistors P4, P5, P6 turned on in response to the inverted latch control signal iosa2b, and the local input/output line latch unit 42 comprises PMOS transistors P7, P8 and the NMOS transistors N9, N10 latching the local input/output line lio and the inverted local input/output line liob. Referring to FIG. 6a, the write driver includes write driver comprises a first pull-up/pull-down signal generator 50, a second pull-up/pull-down signal generator 60, a first driver 70, and a precharger 80. The first pull-up/pull-down signal generator 50 comprises a first driver 52, a first latch 54, a second driver 56, a second latch 57, a first buffer 58 and an inverter IV56. The first driver 52 receives an inverted signal of the global input output line signal giob to drive a node nd60 in response to a first pull-up/pull-down control signal bwen9z. The first latch 54 latches the output signal of the first driver 52. The second driver 56 drives a node nd51 in response to the output signal of the first latch 54, a second pull-up/pull-down control signal bwen12 and a third local input/output precharge control signal liopcgp12. The second latch 57 latches an output signal of the second driver 56. The first buffer 58 buffers an output signal of the second latch 57 to generate a first pull-down signal pd1. The inverter IV56 inverts an output signal of a second buffer 68 to generate a first pull-up signal pu1. The second pull-up pull down signal generator 60 comprises a third driver 62, a third latch 64, a fourth driver 66, a fourth latch 67, a second buffer 68 and a inverter IV66. The third driver 62 receives a delayed global input/output line signal giod to dirve a node nd60 in response to the first pull-up/pull-down control signal bwen9z. The third latch 64 latches a output signal of the third driver 62. The fourth driver 66 drive a node nd61 in response to a output signal of the third latch 64 and the second pull-up/pull-down control signal bwen12 and the third local input/output precharge control signal liopcgp12. The fourth latch 67 latches an output signal of the fourth driver 66. The second buffer 68 is buffers a output signal of the fourth latch 67 to generate a second pull-down signal pd2. The inverter IV66 inverts an output signal of the first buffer 58 to generate a second pull-up signal pu2. The fifth driver 70 drives the local input/output line lio in response to the first pull-down signal pd1 and the first pull-up signal pu1. The sixth driver 72 drives the inverted local input/output line liob in response to the second pull-down signal pd2 and the first pull-up signal pu2. The precharge 80 comprises NNOS transistors N80, N81, N82. NMOS transistors N80, N81, N82 are turned on in response to a second local input/output line precharge signal lio_pcg to supply the bit line precharge voltage VBLP for the local input/output line lio and the inverted local input/output line liob. Referring to FIG. 6b, an inverter IV70 inverts a first local input/output precharge control signal liopcgp10 to generate a second local input/output precharge control signal liopcg11, and an inverter IV71 inverts the second local input/output precharge control signal liopcg11 to generate a third local input-output precharge signal control liopcgp12. An inverter IV72 inverts the pull-up/pull-down control signal bwen to generate a first pull-up/pull-down control signal bwen9z, a third buffer 90 buffers the first pull-up/pull-down control signal bwen9z, and a NOR gate NR1 receives an output signal of the third buffer 90 and the second local input/output precharge control signal liopcg11, and performs an NOR operation to generate a second pull-up/pull-down control signal bwen12.

First, a precharge operation will be described.

Figure 4:
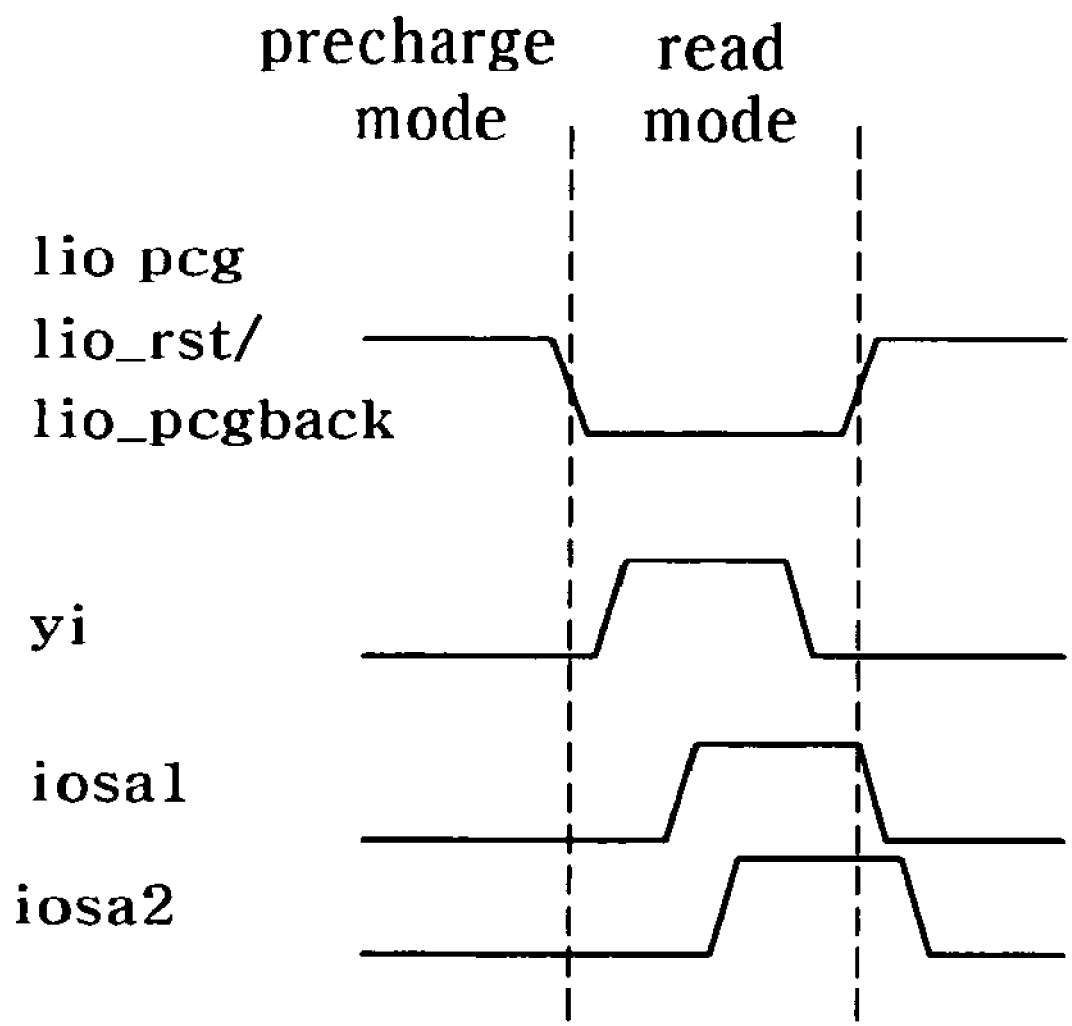
FIG. 4 is a timing diagram of control signals generated from a control signal generator according to the exemplary embodiment of FIGS. 2A through 2C.

As shown in FIG. 4, in a precharge mode, the first and second local input/output line precharge signals liopcg and lio_pcgback and the local input/output line reset signal lio_rst have a high level. In this state, accordingly, NMOS transistors N3 and N6 to N8 shown in FIG. 5, and NMOS transistors N80 to N82 shown in FIG. 6A are turned on, so that a local input/output line lio and an inverted local input/output line liob shown in FIGS. 5 and 6A are precharged with the same voltage VBLP/2. The timings of the first and second local input/output line precharge signals liopcg and lio_pcgback and the local input/output line reset signal lio_rst should be adjusted so that they are maintained in an enable state until an active operation (namely, a read or write operation) is begun, and are disabled after the beginning of the active operation.

Next, a read operation will be described.

When the output enable signal yi is enabled, namely, is transited to a high level, in a read mode, as shown in FIG. 4, NMOS transistors N1 and N2 of FIG. 5 are turned on, so that signals on bit lines amplified by a sense amplifier SA are transferred to the local input/output line lio and inverted local input/output line liob, respectively. When an input/output switch signal bsio is enabled (namely, is transited to a high level), NMOS transistors N4 and N5 of FIG. 5 are turned on. In this state, the signals on the local input/output line lio and inverted local input/output line liob of the core controller 20 are transferred to a local input/output line lio and an inverted local input/output line liob of the column path controller 40, respectively. When the amplification control signal iosa1 is subsequently enabled (namely, is transited to a high level), as shown in FIG. 4, PMOS transistors P1 to P5 are turned on, thereby amplifying the local input/output line lio and inverted local input/output line liob of the column path controller 40. When the latch control signal iosa2 is subsequently enabled (namely, is transited to a high level), as shown in FIG. 4, PMOS transistors P4 to P6 are turned on, thereby latching the amplified signal on the local input/output line lio and inverted local input/output line liob of the column path controller 40. In order to achieve the above-described read operation without any error, it is necessary to appropriately adjust the enable timings of the column path control signals yi, iosa1, and iosa2. That is, the amplification control signal iosa1 and latch control signal iosa2 should be sequentially enabled after enabling of the output enable signal yi. Although the column path control signals yi, iosa1, and iosa2 are influenced by PVT characteristic variations of CMOS transistors, desired timings thereof are maintained because the influences of the PVT characteristic variations on respective column path control signals yi, iosa1, and iosa2 are equal in accordance with the present disclosure.

A write operation will now be described.

Referring to FIG. 6A, when a first pull-up/pull-down control signal bwen9z is enabled (namely, is transited to a high level), an inverted signal of a global input/output line signal, giob, is buffered by a first inverting unit 52, and is then transferred to a first latch 54. Also, a signal giod, which is obtained after delay of a global input/output line signal for a predetermined period, is buffered by a second inverting unit 62, and is then transferred to a second latch 64. Referring to FIG. 6B, the first pull-up/pull-down control signal bwen9z is generated based on the pull-up/pull-down control signal bwen and a local input/output precharge signal liopcgp10. When a second pull-up/pull-down control signal bwen12 is enabled (namely, is transited to a high level), NMOS transistors N53 and N63 are selectively turned on in response to output signals from the first and second inverting units 52 and 62. Accordingly, the NMOS transistors N53 and N63 transfer pulled-down signals to third and fourth latches 57 and 67, respectively. Thereafter, output signals from the third and fourth latches 57 and 67 are delayed by delays 58 and 68 which, in turn, output the delayed signals as first and second pull-up/pull-down signals pu1, pd1, pu2, and pd2. The generated first and second pull-up/pull-down signals pu1, pu2, pd1, and pd2 selectively drive the first and second drivers 70 and 80, so that the global input/output line signal giod and an inverted signal thereof are transferred to the local input/output line lio and inverted local input/output line liob, respectively.

As described above, desired timing margins among the column path control signals liopcg, lio_pcgback, bwen, yi, iosa1, and iosa2 should be maintained, in order to accurately perform precharge and read/write operations controlled by the column path control signals liopcg, lio_pcgback, bwen, yi, iosa1, and iosa2. To this end, in accordance with the present disclosure, the column path control signals liopcg, lio_pcgback, bwen, yi, iosa1, and iosa2 are generated under the condition in which they have been influenced by the same PVT characteristic variation of CMOS transistors. Accordingly, it is possible to prevent errors from occurring in the precharge and read/write operations.

Although the column path control signal generating circuit according to the present disclosure has been described as being used to generate column path control signals, it may be used in various devices which must generate signals influenced by the same PVT characteristic variation.

Although preferred embodiments of the disclosure have been disclosed for illustrative purposes, those skilled in the art will appreciate that various modifications, additions and substitutions are possible, without departing from the scope and spirit of the disclosure and the accompanying claims. For example, elements and/or features of different examples and illustrative embodiments maybe combined with each other and/or substituted for each other within the scope of this disclosure and appended claims.

The present specification is based on and claims priority to Korean patent application number NO 10-2006-101002, filed on Oct. 17, 2006, which is incorporated herein by reference in its entirety.

What is claimed is:

1. A circuit for generating column path control signals in a semiconductor device, comprising:
   a strobe signal delay unit configured to receive a strobe signal, and delay the received strobe signal for different delay periods, to generate a plurality of respective delayed strobe signals; and
   a control signal generator configured to receive at least one of the delayed strobe signals, and perform a logical operation to the received delayed strobe signal, to generate a first column path control signal for controlling an operation of precharging signals on local input/output lines and a second column path control signal for enabling transfer of bit line signals amplified by a sense amplifier to the local input/output lines.

2. The circuit according to claim 1, wherein the strobe signal delay unit comprises a plurality of delays connected in series.

3. The circuit according to claim 2, wherein the delays include respective inverters to form an inverter chain.

4. The circuit according to claim 1, wherein the strobe signal delay unit comprises:
   a first delay unit configured to delay the strobe signal for a first delay period, to generate a first delayed strobe signal; and
   a second delay unit configured to delay the first delayed strobe signal for a second delay period, to generate a second delayed strobe signal.

5. The circuit according to claim 4, wherein the control signal generator comprises:
   a logic unit configured to receive the first and second delayed strobe signals, and perform a logical operation to the received first and second delayed strobe signals; and
   a buffer configured to receive an output signal from the logic unit, and buffer the received output signal, to generate the second column path control signal.

6. The circuit according to claim 5, wherein the logic unit performs an AND operation and the buffer includes an inverter.

7. The circuit according to claim 6, wherein the buffer includes an inverter.

8. The circuit according to claim 1, further comprising:
   a delay configured to delay an output signal from the strobe signal delay unit for a predetermined period, to generate a third column path control signal for controlling a signal on a local input/output line in a read operation.

9. The circuit according to claim 1, further comprising:
   a first delay configured to delay an output signal from the strobe signal delay unit for a predetermined period, to generate a third column path control signal for controlling an operation of amplifying a signal on a local input/output line in a read operation; and
   a second delay configured to delay the third column path control signal for a predetermined period, to generate a fourth column path control signal for controlling an operation of latching the amplified signal on the local input/output line.

10. A circuit for generating column path control signals in a semiconductor device, comprising:
   a strobe signal delay unit configured to receive a strobe signal, and delay the received strobe signal for a first predetermined period, to generate a delayed strobe signal;
   a first delay configured to delay the delayed strobe signal for a second predetermined period, to generate a first column path control signal for controlling an operation of amplifying a signal on a local input/output line in a read operation; and
   a second delay configured to delay the first column path control signal for a third predetermined period, to generate a second column path control signal for controlling an operation of latching the amplified signal on the local input/output line.

11. A circuit for generating column path control signals in a semiconductor device, comprising:
   a strobe signal delay unit configured to receive a strobe signal, and delay the received strobe signal for different delay periods, and to generate a plurality of respective delayed strobe signals;
   a control signal generator configured to receive at least one of the delayed strobe signals, and perform a logical operation to the received delayed strobe signals, to generate a first column path control signal for controlling an operation of precharging signals on local input/output lines and a second column path control signal for enabling transfer of bit line signals amplified by a sense amplifier to the local input/output lines;
   a first delay for delaying an output signal from the strobe signal delay unit for a predetermined period, to generate a third column path control signal for controlling an operation of amplifying a signal on a local input/output line in a read operation; and
   a second delay for delaying the second column path control signal for a predetermined period, to generate a fourth column path control signal for controlling an operation of latching the amplified signal on the local input/output line.

12. The circuit according to claim 11, wherein the control signal generator comprises:
   a logic unit configured to receive the first and second delayed strobe signals, and perform a logical operation to the received delayed strobe signals; and
   a buffer configured to receive an output signal from the logic unit, and buffer the received output signal, to generate the first column path control signal.

13. The circuit according to claim 12, wherein the logic unit performs an AND operation, and the buffer includes an inverter.

14. The circuit according to claim 11, wherein the control signal generator comprises:
   a logic unit configured to receive the first and second delayed strobe signals, and perform a logical operation to the received delayed strobe signals; and a buffer configured to receive an output signal from the logic unit, and buffer the received signal, to generate the second column path control signal.

15. A method for generating column path control signals in a semiconductor device, comprising:

generating a plurality of delayed strobe signals delayed from a strobe signal for different respective delay periods;

selecting at least one from the plurality of delayed strobe signals; and performing a logical operation to the selected at least one delayed strobe signal, thereby generating a first column path control signal for controlling an operation of precharging signals on local input/output lines and a second column path control signal for enabling transfer of bit line signals amplified by a sense amplifier to the local input/output lines.

16. The method according to claim 15, further comprising:

delaying the selected delayed strobe signal for a predetermined period, thereby generating a second column path control signal for controlling a signal on a local input/output line in a read operation.

17. The method according to claim 15, further comprising:

delaying the selected delayed strobe signal for a predetermined period, thereby generating a third column path control signal for controlling an operation of amplifying a signal on a local input/output line in a read operation; and delaying the second column path control signal for a predetermined period, thereby generating a forth column path control signal for controlling an operation of latching the amplified signal on the local input/output line.

18. A method for generating column path control signals in a semiconductor device, comprising:

delaying a strobe signal for a first predetermined period, thereby generating a delayed strobe signal;

delaying the delayed strobe signal for a second predetermined period, thereby generating a first column path control signal for controlling an operation of amplifying a signal on a local input/output line in a read operation; and delaying the first column path control signal for a third predetermined period, thereby generating a second column path control signal for controlling an operation of latching the amplified signal on the local input/output line.

* * * * *